(12) United States Patent
Rettig et al.

(10) Patent No.: US 8,436,710 B2
(45) Date of Patent: May 7, 2013

(54) INTEGRATED CIRCUIT FOR INFORMATION TRANSFER

(75) Inventors: Rasmus Rettig, Hamburg (DE); Werner Schiemann, Fellbach (DE); Franziska Kalb, Fichtelberg (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/496,388

(22) PCT Filed: Jul. 27, 2010

(86) PCT No.: PCT/EP2010/060893
§ 371 (c)(1),
(2), (4) Date: May 30, 2012

(87) PCT Pub. No.: WO2011/032764
PCT Pub. Date: Mar. 24, 2011

(65) Prior Publication Data
US 2012/0229243 A1      Sep. 13, 2012

(30) Foreign Application Priority Data
Sep. 17, 2009  (DE) .................. 10 2009 029 528

(51) Int. Cl.
*H01F 5/00*      (2006.01)
(52) U.S. Cl.
USPC ........................................... 336/200

(58) Field of Classification Search .................. 336/65, 336/200, 232; 257/421, 427, 531; 324/251
See application file for complete search history.

(56) References Cited

U.S. PATENT DOCUMENTS

| | | | |
|---|---|---|---|
| 4,829,352 A * | 5/1989 | Popovic et al. | 257/426 |
| 7,042,323 B2 | 5/2006 | Joerg et al. | |
| 7,419,838 B2 * | 9/2008 | Power et al. | 438/3 |
| 8,067,934 B2 * | 11/2011 | Janke | 324/207.15 |
| 2009/0001964 A1 | 1/2009 | Strzalkowski | |
| 2011/0018532 A1 * | 1/2011 | Florescu et al. | 324/251 |

FOREIGN PATENT DOCUMENTS

| | | |
|---|---|---|
| DE | 42 05 241 | 7/1992 |
| GB | 2255645 A * | 11/1992 |
| JP | 57 048264 | 3/1982 |
| JP | 8 264857 | 10/1996 |

* cited by examiner

*Primary Examiner* — Tuyen Nguyen
(74) *Attorney, Agent, or Firm* — Kenyon & Kenyon LLP

(57) ABSTRACT

An integrated circuit for information transfer, having a substrate, at least one Hall element which is integrated into the substrate or situated on the substrate, a first coil which is situated essentially concentrically with respect to the Hall element and at a distance from the Hall element in the vertical direction and galvanically separated therefrom, and at least one second coil which is situated essentially concentrically with respect to the Hall element and galvanically separated therefrom and situated at a distance from the Hall element and the first coil in the vertical direction. The first coil and the second coil are electrically connected in series so that a current flow in the same direction results in the coils.

7 Claims, 5 Drawing Sheets

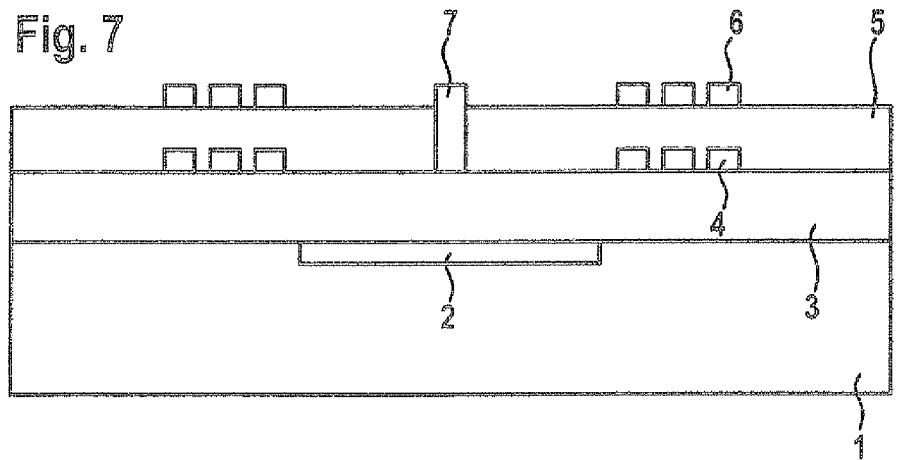
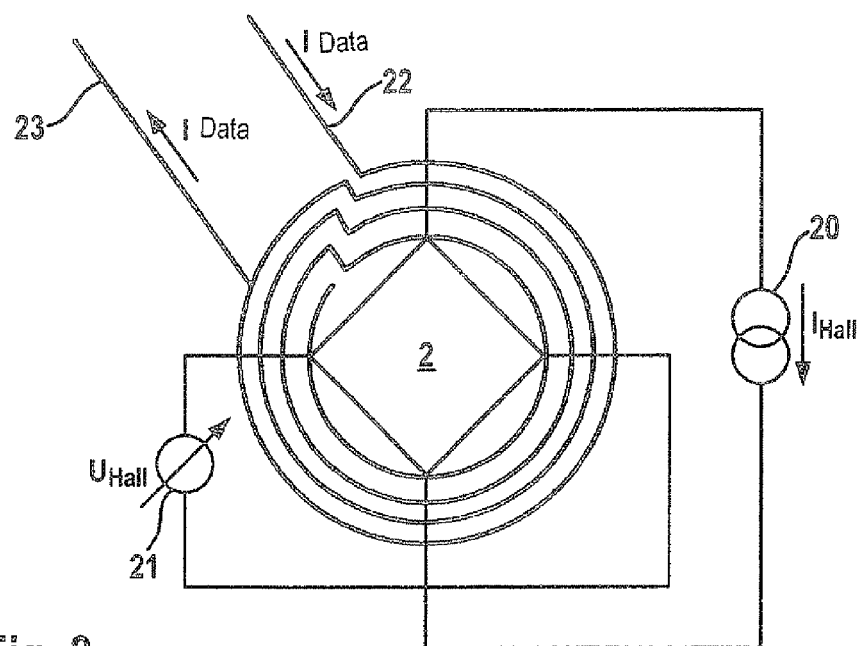

INTEGRATED CIRCUIT FOR INFORMATION TRANSFER

FIELD OF THE INVENTION

The present invention relates to an integrated circuit for information transfer.

BACKGROUND INFORMATION

Within the scope of use of high electrical voltages, for example in the field of electronics for automotive engineering, there is a need to galvanically separate individual electronic circuits from one another, i.e., to keep different circuits at different direct voltage potentials. At the same time, data must be exchanged between these circuits at high speed. Data rates typically range from a few hundred kilobits/second to 50-100 megabits/second for differences in potential between a few hundred volts and several kilovolts.

A potential-free data transmission device between a master level and at least one monolithically integrated sublevel is discussed in DE 42 05 241 C2, having a Hall voltmeter which, via the magnetic field of a coupling loop which is spatially closely connected to, in particular integrated into, the sublevel, evaluates as data information the particular current of a low-resistance, low-inductance two-wire bus line which is connected to the coupling loop.

SUMMARY OF THE INVENTION

The exemplary embodiments and/or exemplary methods of the present invention provide an integrated circuit for information transfer, having a substrate, at least one Hall element which is integrated into the substrate or situated on the substrate, a first coil which is situated essentially concentrically with respect to the Hall element and at a distance from the Hall element in the vertical direction and galvanically separated therefrom, and at least one second coil which is situated essentially concentrically with respect to the Hall element and galvanically separated therefrom and situated at a distance from the Hall element and the first coil in the vertical direction, the first coil and the second coil being electrically connected in series in such a way that a current flow in the same direction results in the coils, resulting in a design overlap of their magnetic fields.

The information transfer according to the exemplary embodiments and/or exemplary methods of the present invention is based on the following fundamental principle: A magnetic field which is generated by a data stream, which represents the data information, flowing through a coil is measured with the aid of a Hall element which is electrically separated from the field-generating coil. In this case, the output signal of the Hall element supplies to the galvanically decoupled side of the circuit the information to be transferred. Providing at least two coils which are arranged one on top of the other and connected in series in such a way that a current flow results in the same direction in the coils, causes an increase (for two approximately equal coils, approximately a doubling) in the magnetic field, and thus, a corresponding increase in the signal deviation of the output signal of the Hall element.

The quality and reliability of the information transfer, as well as the maximum achievable data rate, are greatly increased in this way. Another advantage associated with the design of the integrated circuit according to the present invention is that the entire structure is integratable and combinable with components of semiconductor technology, in particular silicon technology, which allows space-saving and cost-effective manufacture. According to one specific embodiment of the present invention, for this purpose a first insulation layer is provided which is situated between the Hall element and the first coil, and a second insulation layer is provided which is situated between the first coil and the second coil. In addition, the circuit may also be directly integrated on a shared chip with the aid of further electronics.

According to one specific embodiment of the present invention, at least one compensation coil may be provided which is controlled in an electrically separate manner; i.e., the compensation coil does not conduct the data stream. This additional compensation coil is situated essentially concentrically with respect to the Hall element and is situated at a distance from the Hall element and the data-carrying coils in the vertical direction.

By the use of a compensation coil, the Hall element may be operated to the greatest extent possible in the range of the zero crossing, i.e., in equilibrium, thus minimizing delays caused by a charge separation occurring in the Hall element. The achievable data rate of the information transfer may thus be noticeably increased in this way.

According to another specific embodiment of the present invention, the integrated circuit has at least one second Hall element which is integrated into the substrate or situated on the substrate, a third coil which is situated essentially concentrically with respect to the second Hall element and at a distance from the second Hall element in the vertical direction and galvanically separated therefrom, and at least one fourth coil which is situated essentially concentrically with respect to the second Hall element and at a distance from the second Hall element and the third coil in the vertical direction, the coils being electrically connected in series in such a way that a current flow results in the same direction in the third and the fourth coils which is opposite to the current flow in the first and the second coils.

Providing two adjacently situated coil pairs which are interconnected in such a way that a current flow in the same direction results in each case in the two coils which are arranged one on top of the other, and a current flow in the opposite direction results in each case in the two adjacently situated coils, allows a differential evaluation of the output signals of the Hall elements, thus resulting in a distinct improvement in the interference immunity to homogeneous external magnetic fields.

According to another specific embodiment of the present invention, at least one of the coils, in particular the coil which is closest to the Hall element, has an annular ring design, in particular in such a way that no vertical overlap area of the coil with the Hall element therebeneath results. As a result of the annular ring design of the coil and the associated reduction or even elimination of an overlap of the coil with the associated Hall element, a greater distance, and therefore a reduced electrical field strength, between the coil and the Hall element is achieved. The electric strength is thus increased, which is advantageous in particular for large differences in potential between the coil and the Hall element.

Also conceivable is an integrated circuit for information transfer, having a substrate, at least one first Hall element and one second Hall element which are integrated into the substrate or situated on the substrate, a first coil which is situated essentially concentrically with respect to the first Hall element and at a distance from the first Hall element in the vertical direction and galvanically separated therefrom, and a second coil which is situated essentially concentrically with respect to the second Hall element and galvanically separated therefrom, and situated at a distance from the second Hall element in the vertical direction, the first coil and the second coil being electrically connected in series in such a way that a current flow results in the opposite direction in the coils. The differential evaluation of the output signals of the two Hall elements which is thus made possible results in increased interference immunity to homogeneous external magnetic fields.

An insulation layer may be provided which is situated between the Hall elements and the coils, so that the insulation layer is completely insulated from the rest of the integrated circuit.

As the result of an annular ring design of the coils, in particular in such a way that no overlap area with the particular associated Hall element results, an increase in the electric strength may also be achieved for an integrated circuit designed in this way, which is advantageous in particular for large differences in potential between the coil and the Hall element. As a result of the annular ring design of the coil and the associated reduction or even elimination of an overlap of the coil with the particular associated Hall element, a greater distance, and therefore a reduced electrical field strength, between the coils and the particular associated Hall element is achieved.

If at least one additional compensation coil is provided for each Hall element, for a configuration of this type it is also possible to minimize the time required for the charge separation within the Hall elements, and thus, to significantly increase the achievable data rate.

Further features and advantages of specific embodiments of the present invention result from the following description, with reference to the appended figures.

BRIEF DESCRIPTION OF THE DRAWINGS

FIG. 7 shows a schematic sectional view of a fifth specific embodiment of the integrated circuit according to the present invention.

FIG. 8 shows a schematic top view of a fifth specific embodiment of the integrated circuit according to the present invention.

DETAILED DESCRIPTION

Figure 1:
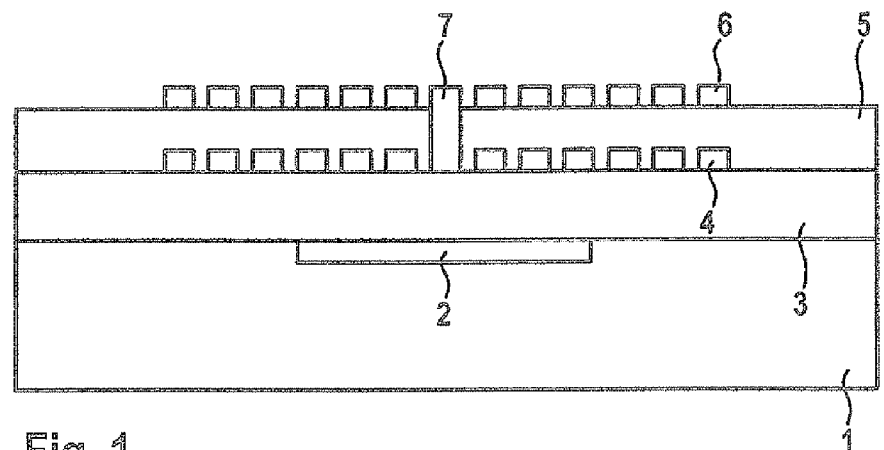
FIG. 1 shows a schematic sectional view of a first specific embodiment of the integrated circuit according to the present invention.

A Hall element 2 is integrated into a substrate 1, for example a doped silicon substrate. A first insulation layer 3, for example silicon oxide, is situated on the surface of substrate 1. A metal-plated layer which includes a first planar coil 4 is present on insulation layer 3. A second insulation layer 5 on which a second planar coil 6 is situated is present above first planar coil 4 in the vertical direction. First coil 4 and second coil 6 are connected to one another in series via a through-connection 7, also frequently referred to as a via, in such a way that when a data stream $I_{stream}$ acts, a current flow in the same direction results in the coils. The data stream represents the information to be transferred.

First coil 4 and second coil 6 are situated at least essentially concentrically with respect to Hall element 2, so that a magnetic field which is generated by a current flow in the coils passes through Hall element 2. Hall element 2 may be integrated into substrate 1, or may be situated on substrate 1. A change in the current flow through the coils causes a change in the resulting magnetic field at Hall element 2. The associated Hall voltage, which is used as an output signal of the Hall element, changes in proportion to the acting magnetic field, and thus, also in proportion to the applied data stream. The data information may be recovered by evaluating the signal flanks of the output signal of the Hall element, i.e., the Hall voltage. Galvanically separated information transfer is thus achieved by electrically insulating Hall element 2 from coils 4 and 6.

It is pointed out that the dimensional proportions in FIGS. 1 through 10 are not illustrated to scale.

Figure 2:
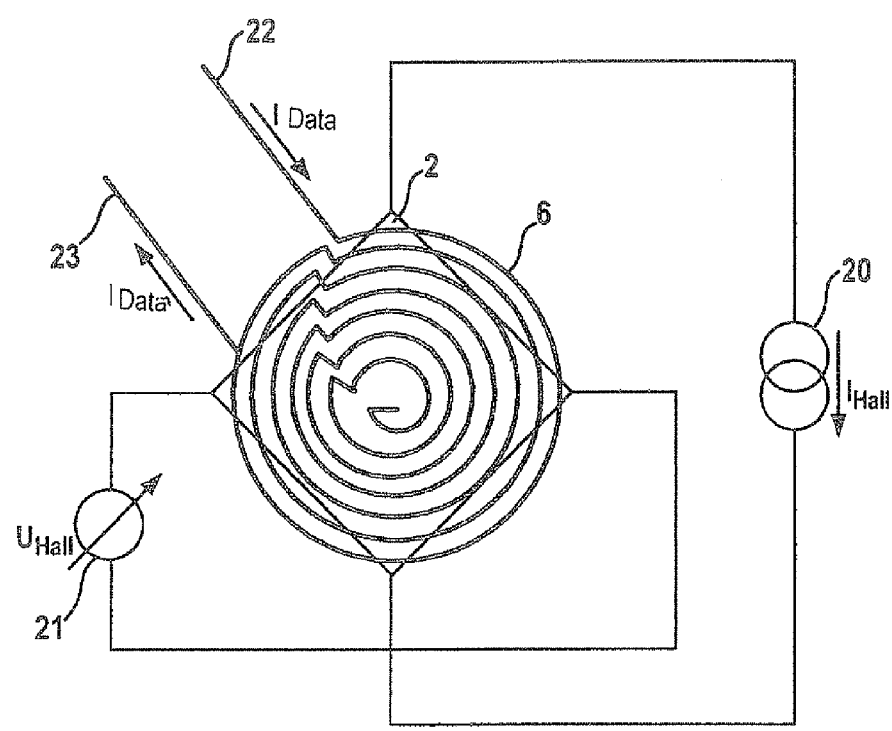
FIG. 2 shows a schematic top view of a first specific embodiment of the integrated circuit according to the present invention.

The schematic top view illustrated in FIG. 2 essentially corresponds to the first specific embodiment of the present invention illustrated in FIG. 1. In addition, a power source 20 is illustrated which supplies Hall element 2 with a current $I_{Hall}$, as well as a voltmeter 21 for measuring the output signal in the form of the voltage drop at Hall element 2. In the top view only second coil 6 is visible, which for the sake of clarity in the illustration has a slightly smaller diameter than in the illustration according to FIG. 1, so that the corners of Hall element 2, illustrated as a square, to which the terminals of power supply 20 and of voltmeter 21 are connected, are not covered by coil 6. In the specific embodiment illustrated, first coil 4 is situated largely congruently beneath second coil 6, and therefore is not illustrated. However, the dimensions and designs of coils 4 and 6 are freely selectable, and may thus be individually adapted to the particular requirements. Thus, for example, as an alternative to the illustrated spiral design of the coils, a different geometric shape may be selected, for example placing the printed conductors of the coil along the edge of a rectangle. Likewise, the diameters and spacings of the individual windings as well as the number of winding turns may be varied as desired. In addition, first coil 4 and second coil 6 may have different designs.

FIG. 2 also schematically shows the supply of data stream $I_{data}$ to second coil 6 in the form of a line structure 22. Line structure 23, likewise illustrated, for returning the data stream is connected not to illustrated second coil 6, but, rather, to first coil 4, which is situated therebeneath and therefore not visible. The two coils 4 and 6 are electrically connected to one another via through-connection 7, not visible in the top view. Of course, as an alternative to the specific embodiment illustrated, data stream $I_{data}$ may initially be conducted to lower first coil 4, and then via through-connection 7 to second coil 6. It is only important that the two coils 4 and 6 are connected in series in such a way that a current flow in the same direction results in the coils.

Figure 3:
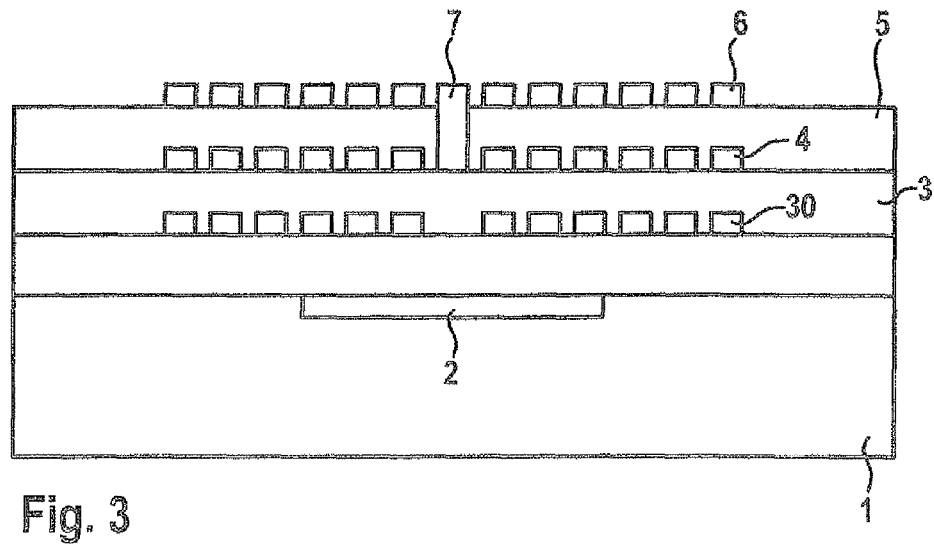
FIG. 3 shows a schematic sectional view of a second specific embodiment of the integrated circuit according to the present invention.

According to the second specific embodiment of the integrated circuit according to the present invention illustrated in FIG. 3, in addition to data-carrying coils 4 and 6 a compensation coil 30 is provided, which is situated essentially concentrically with respect to Hall element 2 and at a distance from Hall element 2 and from coils 4 and 6 in the vertical direction, and which may be controlled in a manner which is electrically separate from coils 4 and 6. The Hall voltage measured by Hall element 2 is used as an input variable of a regulator, not illustrated, which adjusts a compensation current $I_{comp}$ through compensation coil 30 in such a way that the magnetic field generated by the current flow in data-carrying coils 4 and 6 is compensated for by the magnetic field generated by the current flow in compensation coil 30.

Compensation current $I_{comp}$ is then used as a measured variable, on the basis of which the data information to be transferred may be recovered by evaluating the signal flanks. The specific design of the compensation coil may be varied as desired, and in particular is independent from the design of data-carrying coils 4 and 6. By operating the Hall element in a range around the zero crossing, i.e., in equilibrium, time delays for necessary charge separations in the Hall element, which represents a volume semiconductor, may be greatly reduced, and therefore the achievable data rate for the information transfer may be significantly increased. The regulator circuit may advantageously be integrated with Hall element 2 and coils 4 and 6, as well as compensation coil 30, on a shared chip.

Figure 4:
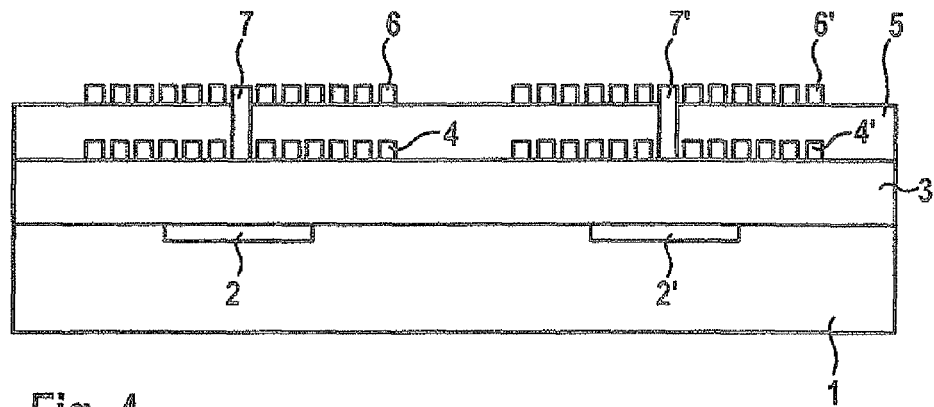
FIG. 4 shows a schematic sectional view of a third specific embodiment of the integrated circuit according to the present invention.

According to a third specific embodiment of the integrated circuit according to the present invention, a second Hall element 2' is integrated into substrate 1 or situated on the substrate (FIG. 4). A third coil 4' is situated on first insulation layer 3, essentially concentrically with respect to this second Hall element 2', and a fourth coil 6' is situated on second insulation layer 5. Third coil 4' and fourth coil 6' are connected in series via a through-connection 7' in such a way that a current flow in the same direction results through the two coils. Coils 4 and 4', 6 and 6' are also connected in series in such a way that in each case a current flow in the opposite direction results in coils 4 and 4' and 6 and 6', respectively.

Figure 5:
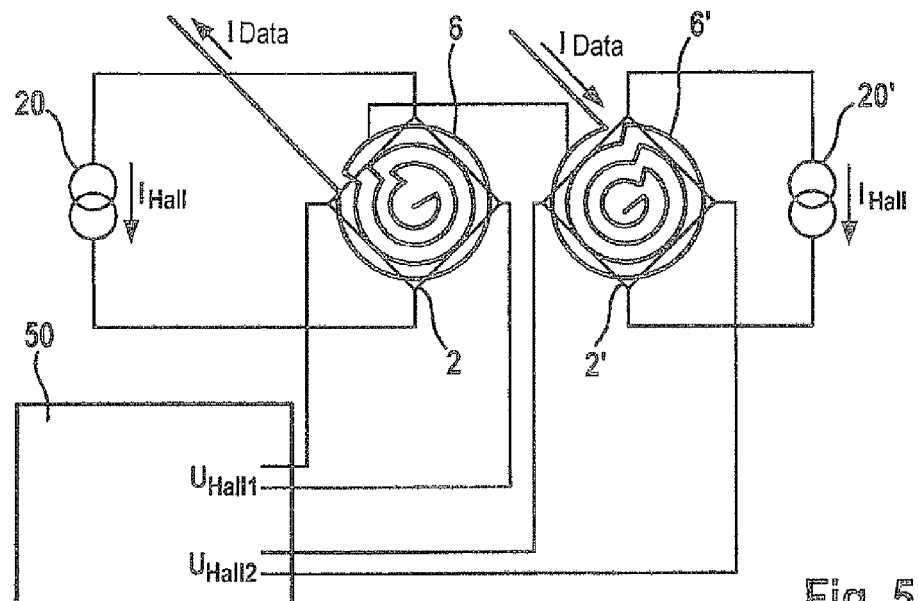
FIG. 5 shows a schematic top view of a third specific embodiment of the integrated circuit according to the present invention.

FIG. 5 illustrates a schematic top view of an integrated circuit according to the third specific embodiment. Power supplies 20 and 20' are provided for Hall elements 2 and 2', respectively. According to the illustrated specific embodiment, data stream $I_{data}$ is supplied to fourth coil 6' and is conducted away by second coil 6. Coils 4 and 4' are each situated approximately congruently beneath coils 6 and 6', respectively, and therefore are not illustrated. In this specific embodiment as well, the specific design of the coils may be varied as desired. In addition, the wiring may be changed in such a way, for example, that the data stream is supplied to a different given coil and optionally also conducted away by a different given coil. For the function according to the present invention, it is only important that the two coils 4 and 6 and 4' and 6', respectively, which are arranged one on top of the other, in each case conduct a current in the same direction, while adjacently situated coils 4 and 4' and 6 and 6', respectively, in each case conduct a current in the opposite direction.

Due to the opposite current direction in coils 4 and 4' and 6 and 6', respectively, and the resulting oppositely directed magnetic fields, it is possible to form the difference of the output signals, i.e., Hall voltages $U_{Hall1}$ of first Hall element 2 and $U_{Hall2}$ of second Hall element 2', in an evaluation circuit 50, and to use this difference as the basis for further evaluation, and thus, for recovering the data signal. As a result of this differential evaluation, increased interference immunity to homogeneous external magnetic fields is achieved, since these act on both Hall elements 2 and 2', and are thus at least largely eliminated in the difference formation.

Figure 6:
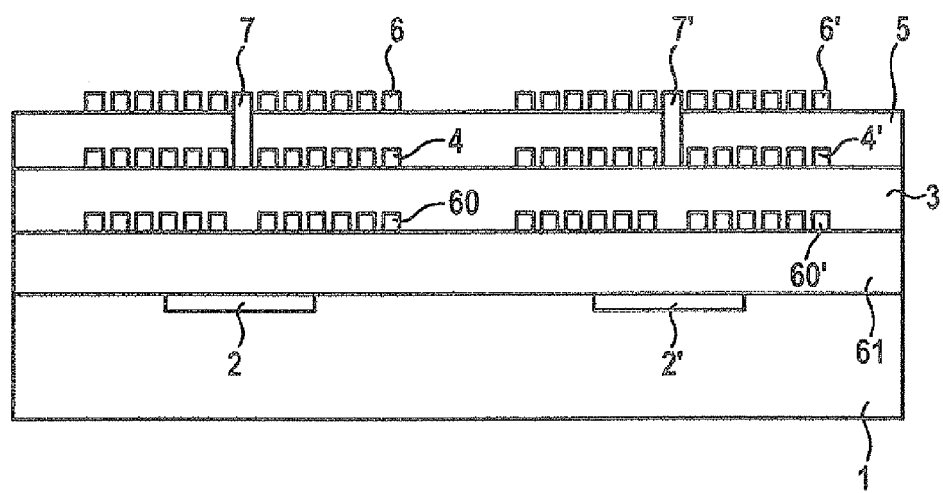
FIG. 6 shows a schematic sectional view of a fourth specific embodiment of the integrated circuit according to the present invention.

FIG. 6 illustrates a refinement of the specific embodiment illustrated in FIGS. 4 and 5, in which additional compensation coils 60 and 60' are provided which are situated on an additional insulation layer 61 present between substrate 1 and insulation layer 3. Compensation coils 60 and 60' are controllable in an electrically separate manner from coils 4, 4', 6, and 6'. The Hall voltages measured by Hall elements 2 and 2' are used as input variables of a regulator, not illustrated, which adjusts compensation currents through compensation coils 60 and 60' in such a way that the magnetic field generated by the current flow in data-carrying coils 4 and 6 and 4' and 6', respectively, is compensated for in each case by the magnetic field generated by the current flow in compensation coils 60 and 60'. Compensation currents $I_{comp1}$ and $I_{comp2}$ are then used as measured variables, on the basis of which the data information to be transferred may be recovered by differential evaluation. By operating the Hall elements in a range around the zero crossing, i.e., in equilibrium, time delays for necessary charge separations in the Hall elements may be greatly reduced, and therefore the achievable data rate for the information transfer may be significantly increased.

According to another specific embodiment of the present invention, first coil 4 and second coil 6 have an annular ring design. In the embodiment illustrated in FIG. 7, the two coils 4 and 6 are designed in such a way that no overlap areas of coils 4 or 6 with Hall element 2 result. In this way, a greater distance between the windings of coils 4 and 6 and Hall element 2, and thus, a reduced electrical field strength between the individual components, is achieved. In this way, the electric strength between coils 4 and 6 and Hall element 2 is thus significantly increased. A specific embodiment is also conceivable in which only one of the coils, which may be first coil 4 which is closer to Hall element 2, has an annular ring design. An annular ring design of at least one coil which results in a partial overlap of the coil with Hall element 2 is also possible.

FIG. 8 illustrates a schematic top view of one specific embodiment according to FIG. 7. For the sake of simplicity, an illustration of through-connection 7, which is used for electrically connecting coils 4 and 6, is dispensed with. Except for the design of the two coils 4 and 6, the specific embodiment according to FIGS. 6 and 7 is the same as the specific embodiment according to FIGS. 1 and 2. Therefore, the statements made for the latter also apply to the specific embodiment according to FIGS. 6 and 7.

In all of the described specific embodiments, even if not explicitly stated or illustrated, one or multiple compensation coils may be used, thus enabling higher data rates.

Figure 9:
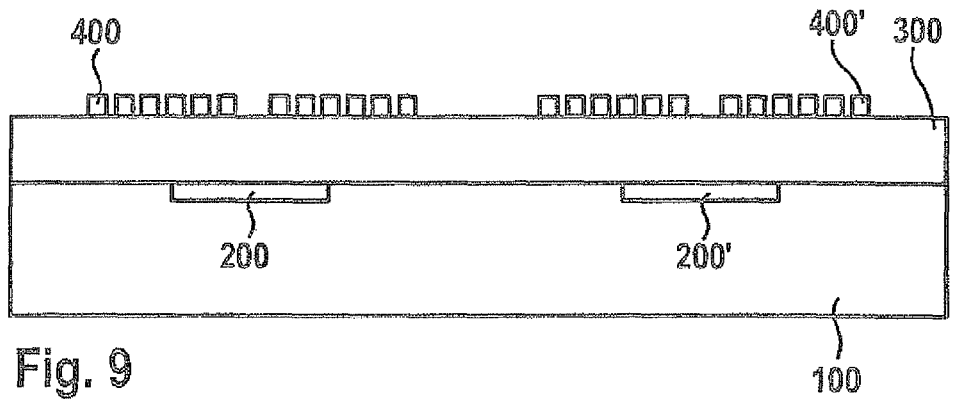
FIG. 9 shows a schematic sectional view of an integrated circuit for differential evaluation of the sensor signals.
Figure 10:
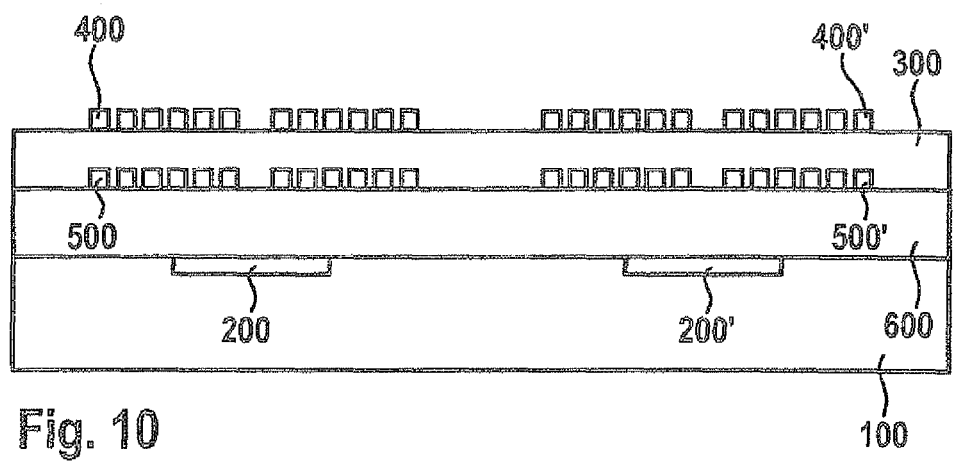
FIG. 10 shows a schematic sectional view of an integrated circuit for differential evaluation of the sensor signals, having compensation coils.
Figure 11:
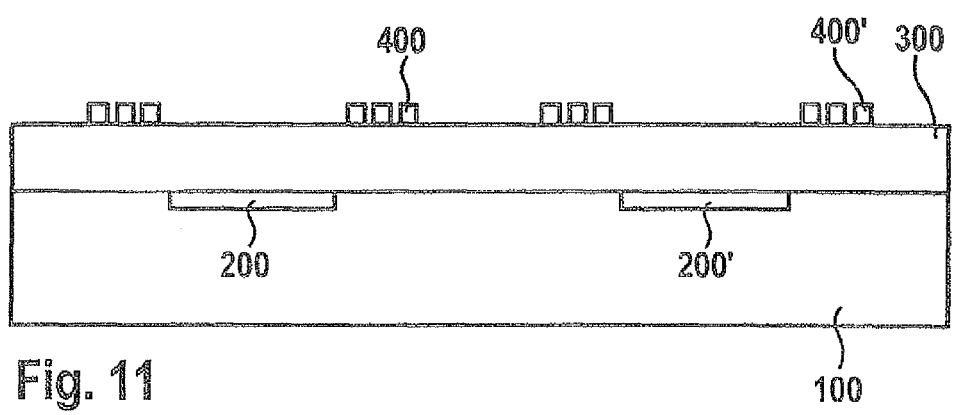
FIG. 11 shows a schematic sectional view of an integrated circuit for differential evaluation of the sensor signals, having increased electric strength.

FIGS. 9 through 11 show other examples of integrated circuits for information transfer.

The example illustrated in FIG. 9 has two Hall elements 200 and 200' which are integrated into substrate 100 or situated on substrate 100. An insulation layer 300, for example silicon oxide, is situated on the surface of substrate 100. A metal-plated layer which includes two planar coils 400 and 400' is present on insulation layer 300. Planar coils 400 and 400' are each situated essentially concentrically with respect to Hall elements 200 and 200', respectively. This configuration allows a differential evaluation of the output voltages of Hall elements 200 and 200', as schematically illustrated in FIG. 5. This requires that coils 400 and 400' are connected in series in such a way that a current flow results in the opposite direction in the two coils, which in turn results in oppositely directed magnetic fields which in each case pass through the associated Hall element.

FIG. 10 illustrates one refinement of the integrated circuit illustrated in FIG. 8, in which additional compensation coils 500 and 500' are provided, which are situated on an additional insulation layer 600 present between substrate 100 and insulation layer 300. Compensation coils 500 and 500' are controllable in an electrically separate manner from coils 400 and 400'. The Hall voltages measured by Hall elements 200 and 200' are used as input variables of a regulator, not illustrated, which adjusts compensation currents through compensation coils 500 and 500' in such a way that the magnetic field generated by the current flow in data-carrying coils 400 and 400' is compensated for in each case by the magnetic field generated by the current flow in compensation coils 500 and 500'. Compensation currents $I_{comp1}$ and $I_{comp2}$ are then used as measured variables, on the basis of which the data information to be transferred may be recovered by differential evaluation. By operating the Hall elements in a range around the zero crossing, i.e., in equilibrium, time delays for necessary charge separations in the Hall elements may be greatly reduced, and therefore the achievable data rate for the information transfer may be significantly increased.

FIG. 11 shows another refinement of the integrated circuit illustrated in FIG. 8. Coils 400 and 400' have an annular ring design, so that coils 400 and 400' do not overlap with Hall elements 200 and 200', respectively. In this way, a greater distance between the windings of coils 400 and 400' and Hall elements 200 and 200', respectively, and therefore a reduced electrical field strength between the coils and the particular associated Hall element, is achieved in each case. The electric strength between coils 400 and 400' and Hall elements 200 and 200', respectively, is thus significantly increased, which is advantageous in particular for large differences in potential between the coils and the Hall elements. An annular ring design of coils 400 and 400' which results in a partial overlap of the coils with the particular associated Hall element 200 or 200' is also conceivable.

What is claimed is:

1. An integrated circuit for information transfer, comprising:
   a substrate;
   at least one Hall element, which is one of integrated into the substrate and situated on the substrate;
   a first coil, which is situated essentially concentrically with respect to the Hall element and at a distance from the Hall element in the vertical direction and galvanically separated therefrom; and
   at least one second coil, which is situated essentially concentrically with respect to the Hall element and galvanically separated therefrom and situated at a distance from the Hall element and the first coil in the vertical direction, wherein the first coil and the second coil are electrically connected in series so that a current flow in a same direction results in the coils;
   at least one second Hall element, which is at least one of integrated into the substrate and situated on the substrate;
   a third coil, which is situated essentially concentrically with respect to the second Hall element and at a distance from the second Hall element in the vertical direction and galvanically separated therefrom; and
   a fourth coil, which is situated essentially concentrically with respect to the second Hall element and at a distance from the second Hall element and the third coil in the vertical direction, the coils being electrically connected in series so that a current flow results in a same direction in the third coil and the fourth coil which is opposite to the current flow in the first coil and the second coil.

2. The integrated circuit of claim 1, further comprising:
   a first insulation layer, which is situated between the Hall element and the first coil; and
   a second insulation layer, which is situated between the first coil and the second coil.

3. The integrated circuit of claim 1, further comprising:
   at least one compensation coil, which is situated essentially concentrically with respect to the Hall element and at a distance from the Hall element and the coils in the vertical direction, wherein the compensation coil is controllable separately from the first coil and the second coil.

4. The integrated circuit of claim 3, further comprising:
   at least two compensation coils, which are situated essentially concentrically with respect to the associated Hall element and at a distance from the Hall elements and the coils in the vertical direction, wherein the compensation coils are controllable separately from the coils.

5. The integrated circuit of claim 1, wherein at least one of the coils and the compensation coils include planar coils.

6. The integrated circuit of claim 1, wherein at least one of the coils has an annular ring design.

7. The integrated circuit of claim 4, wherein the at least one coil is configured so that there is no overlap area with a Hall element.

* * * * *